(12) United States Patent
Kim et al.

(10) Patent No.: US 12,474,644 B2
(45) Date of Patent: Nov. 18, 2025

(54) DEVICE AND METHOD FOR OVERLAY MEASUREMENT WHICH CONTROL FOCUS MOVEMENT

(71) Applicant: SAMSUNG ELECTRONICS CO., LTD., Suwon-si (KR)

(72) Inventors: Jun Yeob Kim, Suwon-si (KR); Woo Yong Lim, Suwon-si (KR); Ji Yun Jung, Seoul (KR)

(73) Assignees: SAMSUNG ELECTRONICS CO., LTD., Suwon-si (KR); AUROS Technology, Inc., Hwaseong-si (KR)

( * ) Notice: Subject to any disclaimer, the term of this patent is extended or adjusted under 35 U.S.C. 154(b) by 131 days.

(21) Appl. No.: 18/385,177

(22) Filed: Oct. 30, 2023

(65) Prior Publication Data

US 2024/0377757 A1  Nov. 14, 2024

(30) Foreign Application Priority Data

May 8, 2023  (KR) .................. 10-2023-0059412

(51) Int. Cl.
*G03F 7/00* (2006.01)
(52) U.S. Cl.
CPC .... *G03F 7/70633* (2013.01); *G03F 7/706831* (2023.05); *G03F 7/706845* (2023.05); *G03F 7/706849* (2023.05)
(58) Field of Classification Search
CPC .......... G03F 7/70633; G03F 7/706831; G03F 7/706849; G03F 7/706845
See application file for complete search history.

(56) References Cited

U.S. PATENT DOCUMENTS

| 6,094,223 | A | 7/2000 | Kobayashi |
| 6,553,137 | B1 * | 4/2003 | Tomimatu ........... G03F 7/70633 382/148 |
| 7,218,399 | B2 | 5/2007 | Hayano |
| 9,104,120 | B2 | 8/2015 | Seligson et al. |

(Continued)

FOREIGN PATENT DOCUMENTS

| JP | 2000-294499 A | 10/2000 |
| KR | 10-1714616 B1 | 4/2017 |

(Continued)

OTHER PUBLICATIONS

Office Action dated Apr. 4, 2025, issued by Korean Patent Office in Korean Patent Application No. 10-2023-0059412.

*Primary Examiner* — Kevin K Pyo
*Assistant Examiner* — Don J Williams
(74) *Attorney, Agent, or Firm* — Sughrue Mion, PLLC

(57) ABSTRACT

An overlay measurement device includes a light source configured to direct an illumination to an overlay measurement target in which a first overlay key in a first layer and a second overlay key in a second layer are positioned, the second layer being stacked on an upper portion or a lower portion of the first layer, a lens assembly including an objective lens configured to condense the illumination on a measurement position of at least one point in the overlay measurement target and a lens focus actuator configured to control a distance between the objective lens and the overlay measurement target, and a detector configured to acquire a focus image at the measurement position based on a beam reflected on the measurement position.

20 Claims, 7 Drawing Sheets

(56) References Cited

U.S. PATENT DOCUMENTS

| | | |
|---|---|---|
| 9,661,212 B2 | 5/2017 | Oishi et al. |
| 10,598,892 B2 | 3/2020 | Tanaka |
| 10,663,281 B2 | 5/2020 | Manassen et al. |
| 10,897,566 B2 | 1/2021 | Gutman et al. |
| 11,835,865 B2 | 12/2023 | Shin et al. |
| 2013/0259358 A1* | 10/2013 | Chen .................... G06T 7/68 382/149 |
| 2022/0326008 A1 | 10/2022 | Park et al. |

FOREIGN PATENT DOCUMENTS

| | | |
|---|---|---|
| KR | 10-2273278 B1 | 7/2021 |
| KR | 10-2524462 B1 | 4/2023 |

\* cited by examiner

DEVICE AND METHOD FOR OVERLAY MEASUREMENT WHICH CONTROL FOCUS MOVEMENT

CROSS-REFERENCE TO RELATED APPLICATIONS

This application is based on and claims priority to Korean Patent Application No. 10-2023-0059412, filed on May 8, 2023, in the Korean Intellectual Property Office, the disclosure of which is incorporated herein by reference in its entirety.

BACKGROUND

1. Field

Example embodiments of the disclosure relate to an overlay measurement device and an overlay measurement method of a wafer.

2. Description of Related Art

As technology further develops, a size of a semiconductor device is decreasing, whereas the density of an integrated circuit formed on a wafer is increasing. In order to form the integrated circuit on the wafer, many manufacturing processes may be performed such that a desired circuit structure and desired circuit elements are sequentially formed at specific locations. In such a manufacturing process, patterned layers may be sequentially generated on the wafer.

Through the repeated lamination processes, electrically activated patterns may be generated in the integrated circuit. In this case, if respective structures are not aligned within an error range permitted in a production process, an inference may occur between the electrically activated patterns, and there may be a problem in performance and reliability of the manufactured circuit due to such a phenomenon. In order to measure and verify an alignment error between layers, an overlay measurement device may be used, in which a focal position is found through a contrast or a phase difference in an image for the wafer.

However, each layer thickness or reflection surface stacked in a measurement position in the wafer is not constant, causing the focus not constant, and thus the measured image is not clear. In addition, the focus of the plurality of measurement positions in the wafer and the focus of each layer cannot be precisely found, and the accuracy of the overlay value measured is lowered.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide a device, a method, and a storage medium for overlay measurement that control focus movement and efficiently determine a measurement focus by finding an accurate focus peak point for each layer in which the focus is not constant and determining a measurement focus applied for each of a plurality of measurement positions in a wafer to find an optimal focal distance.

Additional aspects will be set forth in part in the description which follows and, in part, will be apparent from the description, or may be learned by practice of the presented embodiments.

According to an aspect of an example embodiment, an overlay measurement device may include a light source configured to direct an illumination to an overlay measurement target in which a first overlay key in a first layer and a second overlay key in a second layer are positioned, the second layer being stacked on an upper portion or a lower portion of the first layer, a lens assembly including an objective lens configured to condense the illumination on a measurement position of at least one point in the overlay measurement target and a lens focus actuator configured to control a distance between the objective lens and the overlay measurement target, a detector configured to acquire a focus image at the measurement position based on a beam reflected on the measurement position, and a controller configured to control the lens assembly to measure a plurality of images with a plurality of predetermined setting focuses, determine a maximum point of a contrast index (CI) value for a focus change based on a plurality of CI information indicating a change of contrast of each of the plurality of images, and select a focus for the maximum point as a measurement focus.

According to an aspect of an example embodiment, an overlay measurement method may include directing, by a light source, an illumination to an overlay measurement target in which a first overlay key in a first layer and a second overlay key in a second layer are positioned, the second layer being stacked on an upper portion or a lower portion of the first layer, condensing, by an objective lens, the illumination on a measurement position of at least one point in the overlay measurement target, controlling, by a lens actuator, a distance between the objective lens and the overlay measurement target, acquiring a focus image at the measurement position based on a beam reflected on the measurement position, controlling a lens assembly to measure a plurality of images with a plurality of predetermined setting focuses, determining a maximum point of a CI value for a focus change based on a plurality of CI information indicating a change of contrast of each of the plurality of images, and selecting a focus for the maximum point as a measurement focus.

According to an aspect of an example embodiment, a non-transitory, computer-readable storage medium may store instructions that, when executed by at least one processor, cause the at least one processor to direct, by a light source, an illumination to an overlay measurement target in which a first overlay key in a first layer and a second overlay key in a second layer are positioned, the second layer being stacked on an upper portion or a lower portion of the first layer, condense, by an objective lens, the illumination on a measurement position of at least one point in the overlay measurement target, control, by a lens actuator, a distance between the objective lens and the overlay measurement target, acquire a focus image at the measurement position based on a beam reflected on the measurement position, control a lens assembly to measure a plurality of images with a plurality of predetermined setting focuses, determine a maximum point of a CI value for a focus change based on a plurality of CI information indicating a change of contrast of each of the plurality of images, and select a focus for the maximum point as a measurement focus.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
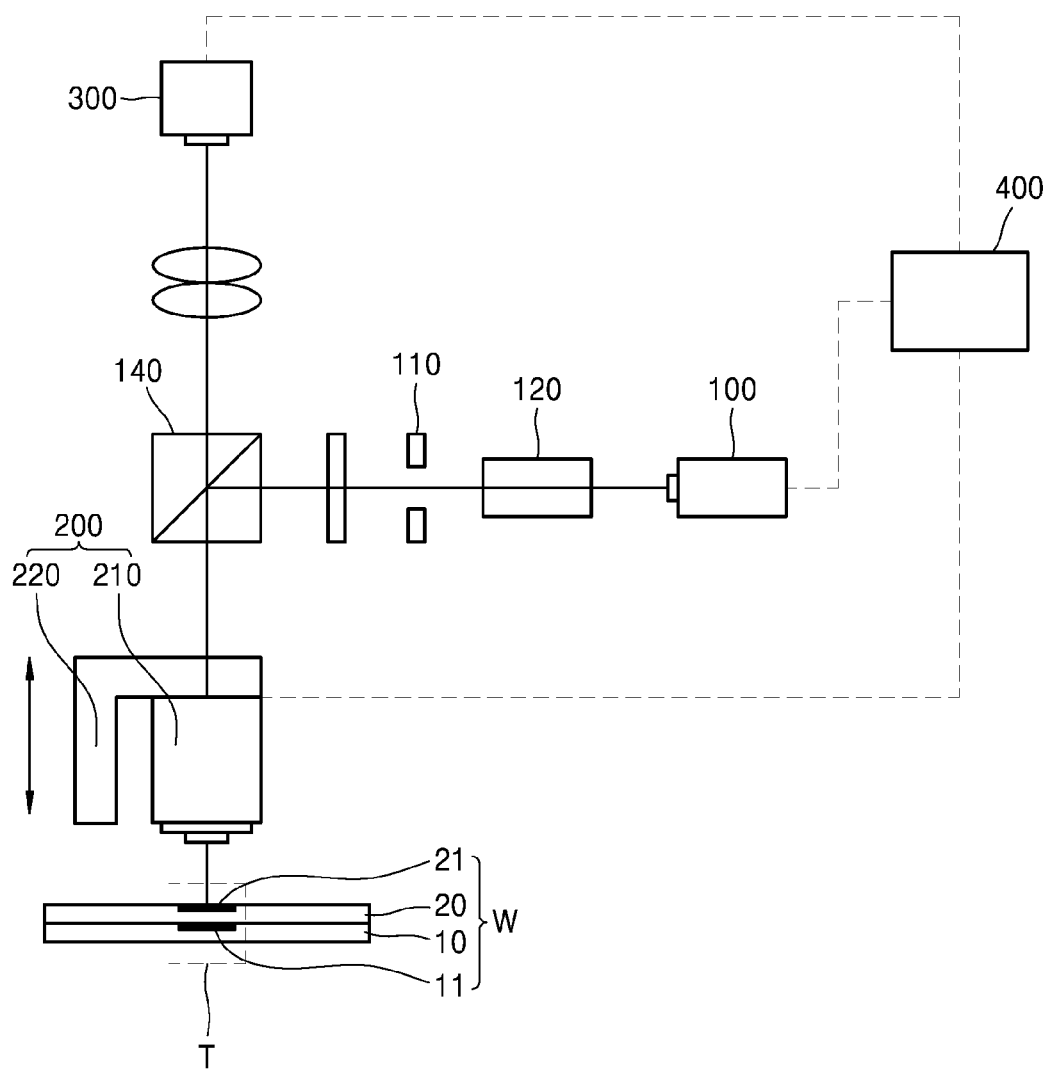
FIG. 1 is a diagram illustrating an overlay measurement device according to an embodiment of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The embodiments of the disclosure are provided to explain the disclosure more completely to those skilled in the art, and the following embodiments may be transformed into several different forms, and the scope of the disclosure is not limited to the following embodiments. On the contrary, the embodiments are provided to be further and complete, and to fully convey the ideas of the disclosure to those skilled in the art. In addition, the thickness and size of each layer in the drawing is exaggerated for the convenience and clarity of the description.

Hereinafter, the embodiments of the disclosure will be described with reference to the drawings schematically illustrating the embodiments of the disclosure. In the drawings, for example, according to the manufacturing technology and/or tolerance, the deformation of the shown shape may be expected. Accordingly, an embodiment of the disclosure is not interpreted as limited to a specific shape of the area shown herein, and should include, for example, a change in the shape caused by the manufacture.

FIG. 1 is a diagram schematically illustrating an overlay measurement device according to an embodiment of the disclosure.

An overlay measurement system may be a system that measures an error between a first overlay key 11 and a second overlay key 21 formed on different layers, respectively, which are formed in a wafer W, as shown in FIG. 1.

For example, the first overlay key 11 may be an overlay mark formed on a previous layer, and the second overlay key 21 may be an overlay mark formed on a current layer. The overlay mark may be formed on a scribe line while a layer for forming a semiconductor device is formed in a die area. For example, the first overlay key 11 may be formed jointly with an insulating film pattern, and the second overlay key 21 may be formed jointly with a photoresist pattern formed on the insulating film pattern. In this case, the second overlay key 21 may be exposed to the outside, but the first overlay key 11 may be covered or at least partially covered by a photoresist layer, and may be made of an oxide having a different optical property from the second overlay key 21 made of a photoresist material.

Physical positions of the first overlay key 11 and the second overlay key 21 may be different from each other, but focus surfaces may be the same as or different from each other.

An overlay measurement target T to be described below may include the overlay mark, and the overlay measurement target T may be formed at a plurality of points on the scribe line.

According to an embodiment of the disclosure, the overlay measurement device may generally include a light source 100, a lens assembly 200, a detector 300, and a controller 400.

As illustrated in FIG. 1, an illumination may be directed from at least one illumination source to an overlay measurement target T. Specifically, the light source 100 may be configured to direct the illumination to the overlay measurement target T at which the first overlay key 11 formed in a first layer 10 and the second overlay key 21 formed in a second layer 20 stacked on an upper portion of the first layer 10 are positioned.

For example, the light source 100 may be formed as a halogen lamp, a xenon lamp, a supercontinuum laser, a light emitting diode, a laser inducted lamp, etc., and may include various wavelengths such as ultraviolet (UV), visible ray, or infrared rays (IR), etc., and is not limited thereto.

According to an embodiment of the disclosure, the overlay measurement device may include a stop 110, a spectrum filter 120, a polarization filter 130, and a beam splitter 140.

The stop 110 may be formed as an opaque plate with an opening through which light passes, and a beam emitted by the light source 100 may be changed to a form suitable for irradiating the first overlay key 11 and the second overlay key 21.

The stop 110 may include at least one of an aperture stop for controlling the amount of light and a field stop for controlling a focusing scope of an image, and may be formed between the light source 100 and the beam splitter 140 as illustrated in FIG. 1, and formed between the beam splitter 140 and the lens assembly 200.

The spectrum filter 120 may control a center wavelength and a bandwidth of the beam emitted by the light source 100 to be suitable for acquiring the images of the first overlay key 11 and the second overlay key 21 formed in the overlay measurement target T. For example, the spectrum filter 120 may be formed as at least one of a filter wheel, a linear translation device, a flipper device, and a combination thereof.

The beam splitter 140 may transmit a part of the beam output from the light source 100 and passing through the stop 110, and may reflect a part and separates the beam output from the light source 100 into two beams.

As illustrated in FIG. 1, the lens assembly 200 may have an objective lens 210 that focuses the illumination at a measurement position of any one point in the overlay measurement target T and a lens focus actuator 220 that controls a distance between the objective lens 210 and the overlay measurement target T.

The objective lens 210 may focus the beam reflected on the beam splitter 140 on measurement positions in which the first overlay key 11 and the second overlay key 21 are formed in the wafer W, and collect the reflected beam.

The objective lens 210 may be installed in the lens focus actuator 220.

The lens focus actuator 220 may control a distance between the objective lens 210 and the wafer W to control a focal surface to be positioned in the first overlay key 11 or the second overlay key 21.

The lens focus actuator 220 may control a focal distance by vertically moving the objective lens 210 toward the wafer W by the control of the controller 400.

In this case, the measurement position as at least any one point of the overlay measurement target T may be positioned in the first layer 10 or the second layer 20, and may be formed between the first overlay key 11 and the second overlay key 21. Further, the measurement position may include all depths for each operation according to driving of the lens focus actuator 220.

As illustrated in FIG. 1, the detector 300 may acquire a focus image at the measurement position based on the beam reflected at the measurement position.

The detector 300 may capture a beam output by passing the beam reflected on the overlay measurement target T through the beam splitter 140 to acquire the images of the first overlay key 11 and the second overlay key 21.

The detector 300 may include an optical detector which may measure the beam reflected on the overlay measurement target T, and the optical detector may include, for example, a charge-coupled device (CCD) converting light into a charge to extract the image, a complementary metal-oxide-semiconductor (CMOS) sensor which is one integrated circuit, a photomultiplier tube (PMT) measuring the light, an avalanche photodiode (APD) array as an optical detection device, or various sensors generating or capturing the image.

The detector 300 may include a filter, a polarizer, and a beam block, and may further include an arbitrary collection optical component (not illustrated) for collecting the illumination collected by the objective lens 210.

As illustrated in FIG. 1, the controller 400 may control directing of the illumination irradiated by the light source 100, and control the lens assembly 200 to condense the illumination in the overlay measurement target T and collect the reflected beam, and control the detector 300 to acquire the focus image measured based on the reflected beam collected by the lens assembly 200.

For example, the controller 400 may control the lens assembly 200 to measure a plurality of images by a plurality of predetermined setting focuses with respect to a depth of the overlay measurement target T.

The controller 400 may include an auto recipe optimization (ARO) program that automatically optimizes an overlay measurement recipe based on filter optimization information, stop optimization information, focus optimization information, and pin-hole optimization information.

In this case, the focus optimization information automatically may determine a focus optimization option based on light source operation information, lens operation information, image information, contrast index (CI) information, etc., to automatically select a reference focus capable of detecting the images of the first overlay key 11 and the second overlay key 21.

For example, the controller 400 may determine a maximum point of a CI value for a focus change based on a plurality of CI information indicating the change of the contrast of each of the plurality of measured images, and a focus for the maximum point as a measurement focus.

Figure 2:
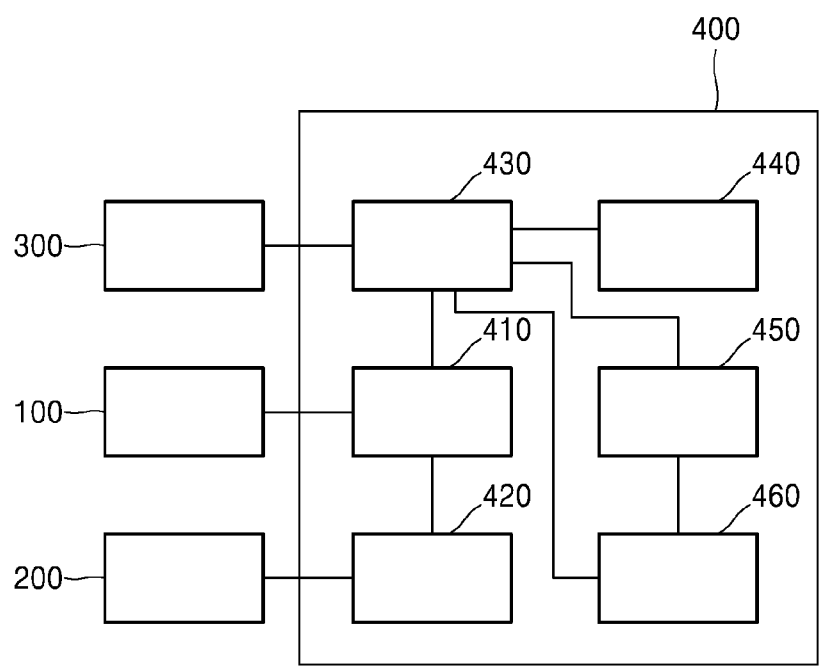
FIG. 2 is a diagram illustrating a controller of the overlay measurement device according to an embodiment of the disclosure.
Figure 3:
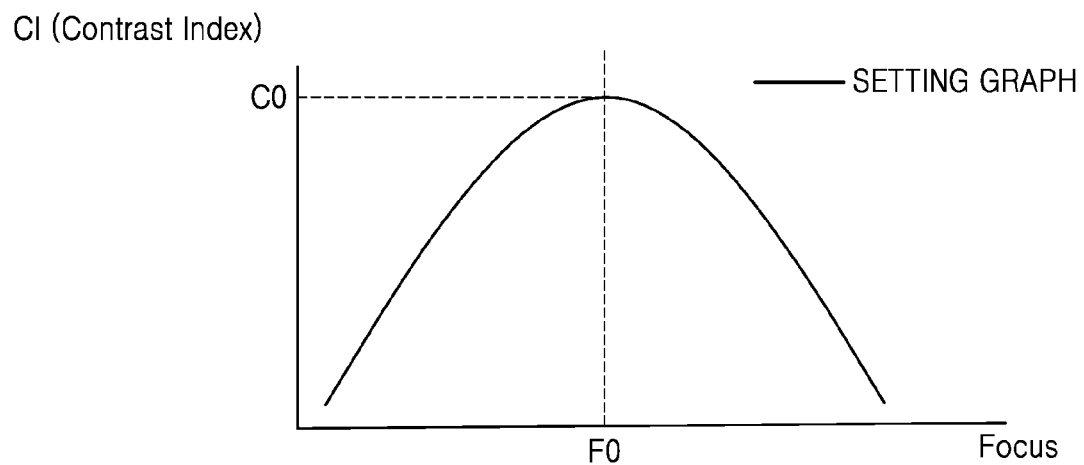
FIGS. 3 to 9 are graphs illustrating results of a controller of the overlay measurement device selecting a measurement focus from a plurality of setting focuses according to an embodiment of the disclosure.

FIG. 2 is a diagram illustrating a controller of the overlay measurement device according to an embodiment of the disclosure. FIGS. 3 to 9 are graphs illustrating results of a controller of the overlay measurement device selecting a measurement focus from a plurality of setting focuses according to an embodiment of the disclosure.

The controller 400 may include a light source operator 410, a lens operator 420, a storage 430, a CI calculation device 440, a maximum point calculation device 450, and an overlay calculation device 460.

As illustrated in FIG. 2, the light source operator 410 may control directing of the illumination emitted by the light source 100, and the lens operator 420 may control an operation of the lens focus actuator 220 to condense the illumination in the overlay measurement target T and acquire the focus images measured based on the plurality of setting focuses.

As illustrated in FIG. 2, the storage 430 may store depth-specific focus images of the overlay measurement target T measured by the plurality of setting focuses.

For example, an in the lens focus actuator 220 may be controlled so as for to the lens operator 420 to measure an interval between the objective lens 210 and the overlay measurement target T for each depth set in the plurality of setting focuses, and as a result, depth-specific focus images having a predetermined difference may be obtained and stored in the storage 430.

The storage 430 may store the plurality of setting focuses. In this case, the plurality of setting focuses may include a pre-input reference focus, and may include a movement focus for measuring an image as a focus widened by a predetermined distance in both directions based on the reference focus.

Specifically, the plurality of setting focuses may include a reference focus F0 determined as a focus at a point having a largest CI based on information on a first layer 10 and a second layer 20 which are pre-input and a movement focus determined as at least two focuses moved according to the setting depth to one side or the other side from the reference focus F0 with respect to the measurement focus so as to determine a CI at focuses having the same interval. That is, the reference focus F0 is a first focus F1, and the movement focus is a second focus F2 and a third focus F3.

For example, when a maximum peak value of a setting graph pre-input is a value of 400 and the predetermined distance is a value of 100, focuses with values of 400, 300, 200, 500, 600, and 700 may be stored as the plurality of setting focuses in the storage 430 such that the image is measured with the focus with a value of 400, which may be the reference focus and subsequently, the image is measured at focus values of 300, 200, 500, 600, and 700, which may be the movement focuses moved by the predetermined distance.

In this case, with respect to the plurality of setting focuses, a measurement order may be changeable to three or more, and the predetermined distance may be changeable and settable to a predetermined value.

The reference focus F0 and the movement focus of the plurality of setting focuses may be determined based on wafer information in which the first layer 10 and the second layer 20 stored in the controller 400 are formed, or determined from previously measured measurement information or directly input from the user.

As illustrated in FIG. 2, the CI calculation device 440 may determine a CI based on the depth-specific focus images of the overlay measurement target T.

Figure 4:
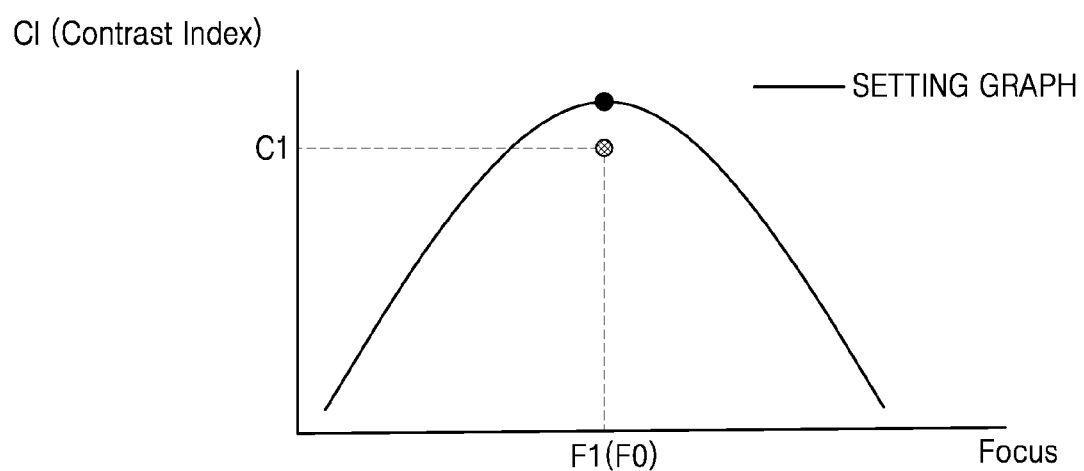

For example, the CI calculation device 440 may determine a CI C1 of the image measured with the reference focus F0 having the largest CI value among the plurality of setting focuses, and for example, as illustrated in FIG. 4, the CI C1 of the image measured with the first focus F1 which is the reference focus F0 may be stored in the storage 430 as first focus-CI information (F1,C1).

In this case, the CI as the CI may refer to an overall contrast degree of an image pixel value, and may be a value representing how the image is clear.

Figure 5:
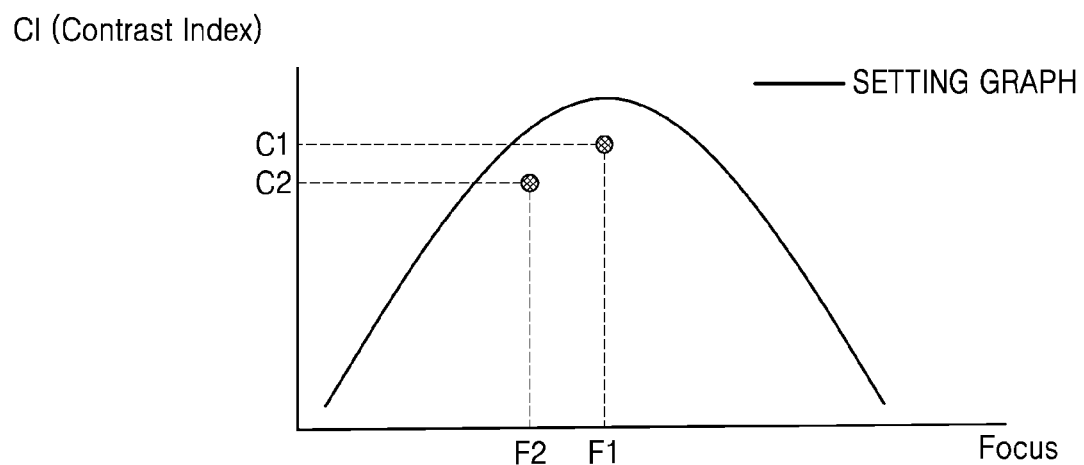

The CI calculation device 440 may determine a CI C2 of the image measured with the second focus F2 among the movement focuses, and for example, as illustrated in FIG. 5, the CI C2 of the image measured with the second focus F2 in which the focus is moved from the first focus F1 to one side by a predetermined distance may be obtained as second focus-CI information (F2,C2) and stored in the storage 430.

Figure 6:
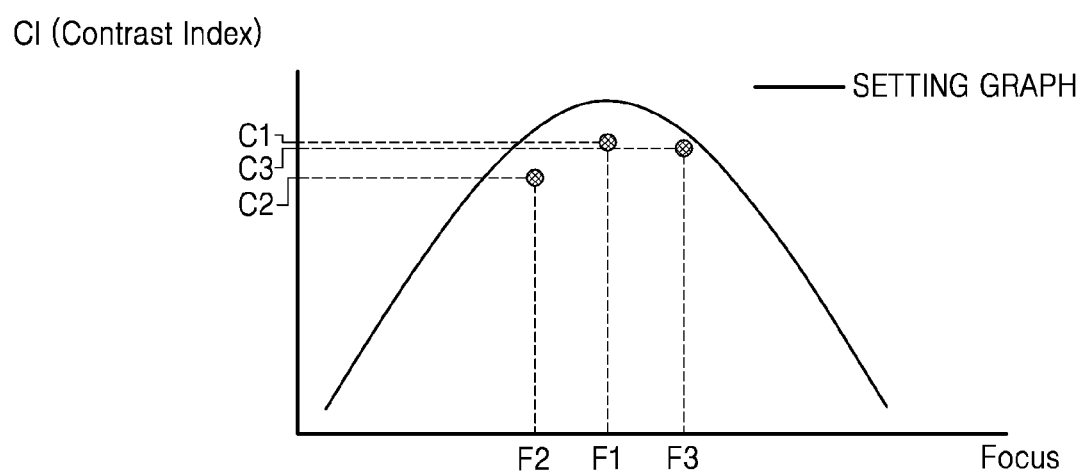

The CI calculation device 440 may determine a CI C3 of the image measured with the third focus C3 among the movement focuses, and for example, as illustrated in FIG. 6, the CI C3 of the image measured with the third focus F3 in which the focus is moved from the reference focus F0 to the other side by a predetermined distance may be obtained as third focus-CI information (F3,C3) and stored in the storage 430.

In this case, the CI of the image measured with the third focus in which the focus is moved from the second focus F2 to one side by the predetermined distance may be obtained as the third focus-CI information and stored in the storage 430.

That is, a maximum CI may be found by measuring the focus while moving the focus constantly widely by the predetermined distance set at the reference focus F0 which is a start focus.

The maximum point calculation device 450 may determine the CI based on the depth-specific focus images of the overlay measurement target T determined by the CI calculation device 440 by a continuous CI graph, and determine a focus for a maximum CI in the CI graph.

Figure 7:
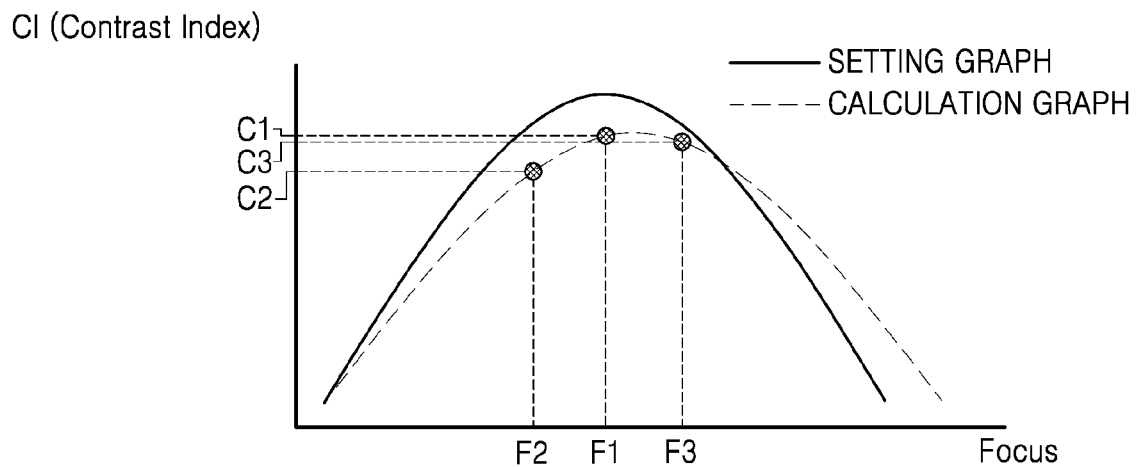

Specifically, as illustrated in FIG. 7, the maximum point calculation device 450 may determine the CI graph based on the first focus-CI information (F1,C1), the second focus-CI information (F2,C2), and the third focus-CI information (F3,C3) determined by the CI calculation device 440 and stored in the storage 430.

For example, the maximum point calculation device 450 may embody the first focus-CI information (F1,C1), the second focus-CI information (F2,C2), and the third focus-CI information (F3,C3) determined by using the Gaussian elimination, and represent the embodied information by the CI graph which is a graph for a tertiary equation based on three points.

The Gaussian elimination as an algorithm of linear logarithm for solving a linear system is a method that converts a linear equation into a matrix and repeatedly applies a basic row computation of the matrix to obtain a solution.

Figure 8:
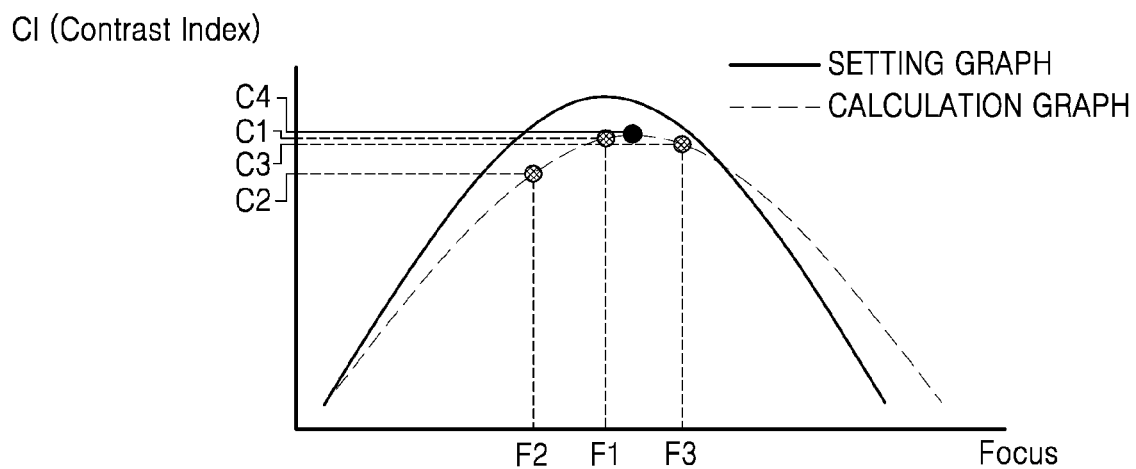

As illustrated in FIG. 8, the maximum point calculation device 450 may determine a maximum point C4 in the C1 graph. For example, the maximum point calculation device 450 may determine the maximum value C4 of the maximum point by using a Newton Raphson Method.

The Newton Raphson Method as a method for finding the solution of the equation approximately may determine the solution by using a slope of a tangent, and the maximum point calculation device 450 may find a solution in which the slope is 0 and determine the solution as the maximum value.

Figure 9:
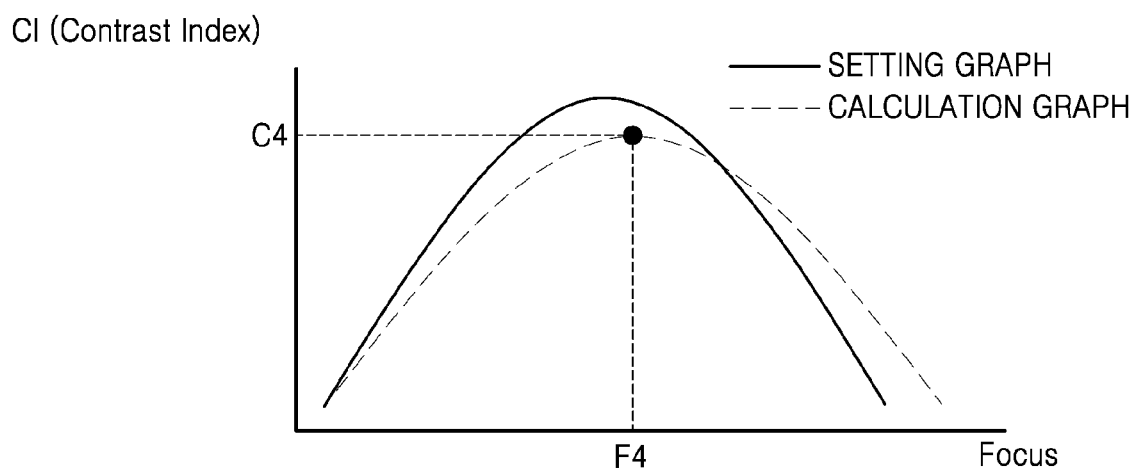

As illustrated in FIG. 9, the maximum point calculation device 450 may determine focus having the maximum point C4 in the CI graph as the measurement focus F4.

That is, the controller 400 of the overlay measurement device according to the disclosure may control to measure a setting focus having at least three focuses including one reference focus F0 and at least two movement focuses, and as a result, the controller 400 determines the maximum value based on at least three focus-CI information to determine an accurate measurement focus.

A display may be included so as to be monitored by the user, and may include an input device which may be directly controlled by the user.

That is, the images of the overlay measurement target T determine by the storage 430, the CI calculation device 440, the maximum point calculation device 450, and the overlay calculation device 460, the graph expressing the focus-CI information, and the CI value may be confirmed through the display, and the user may directly control the light source operator 410 and the lens operator 420 through the input device, or the image of the measurement target T, the graph expressing the focus-CI information, and the CI value may be directly selected, changed, and determined.

The overlay measurement device may include a memory storing instructions, programs, logic, etc., for controlling operations of respective components of the overlay measurement device by the controller 400, and the components may be added, changed, or deleted as necessary.

The overlay measurement device according to an embodiment of the disclosure may move the lens assembly 200 to the overlay measurement target T to determine the measurement focus of each of the first layer 10 and the second layer 20 of the overlay measurement target T.

Specifically, the controller 400 may control the lens assembly 200 so as to measure a plurality of images for the first layer 10 with first setting focuses among the plurality of setting focuses stored in the storage 430, and the CI calculation device 440. The maximum point calculation device 450 may determine a first maximum point based on first CI information representing a contrast change for each image of the first layer 10, and select the focus for the first maximum point as the first measurement focus.

The controller 400 may control the lens assembly 200 so as to measure a plurality of images for the second layer 20 with second setting focuses among the plurality of setting focuses stored in the storage 430, and the CI calculation device 440. The maximum point calculation device 450 may determine a second maximum point based on second CI information representing a contrast change for each image of the second layer 20, and select the focus for the second maximum point as the second measurement focus.

That is, the first setting focuses and the second setting focuses may vary according to the first layer 10 and the second layer 20, and as a result, the first measurement focus and the second measurement focus may be determined as the optimal focus capable of measuring the images of the first layer 10 and the second layer 20.

The overlay calculation device 460 may compare the first measurement focus and the second measurement focus stored in the storage 430 to determine the overlay value. Specifically, the overlay calculation device 460 may determine, as the overlay value, a difference in center point or a symmetric center between the first image and the second image measured with the first measurement focus for the first layer 10 and the second measurement focus for the second layer 20 determined by the CI calculation device 440 and the maximum point calculation device 450.

That is, the overlay measurement device according to the disclosure may determine the accurate measurement focus based on a setting focus according to each layer in a wafer including two or more layers, and as a result, measurement accuracy is increased, and a consistent result may be derived by data based automatic optimization with respect to an optimization result which is largely influenced by individual abilities of workers.

Figure 10:
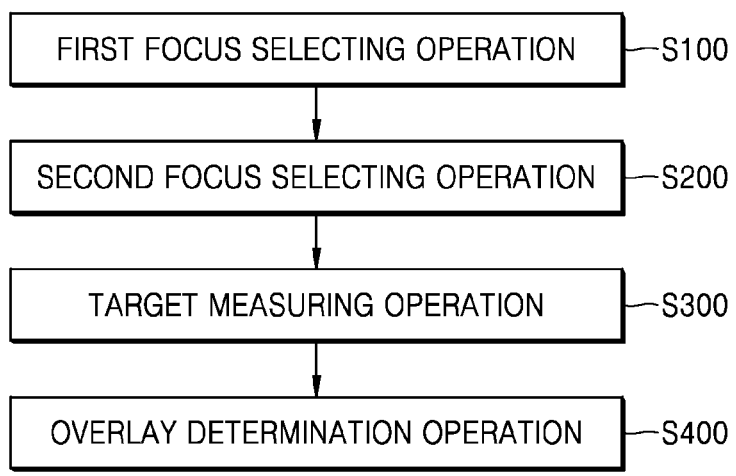
FIGS. 10 to 12 are flowcharts illustrating an overlay measurement method according to an embodiment of the disclosure.
Figure 11:
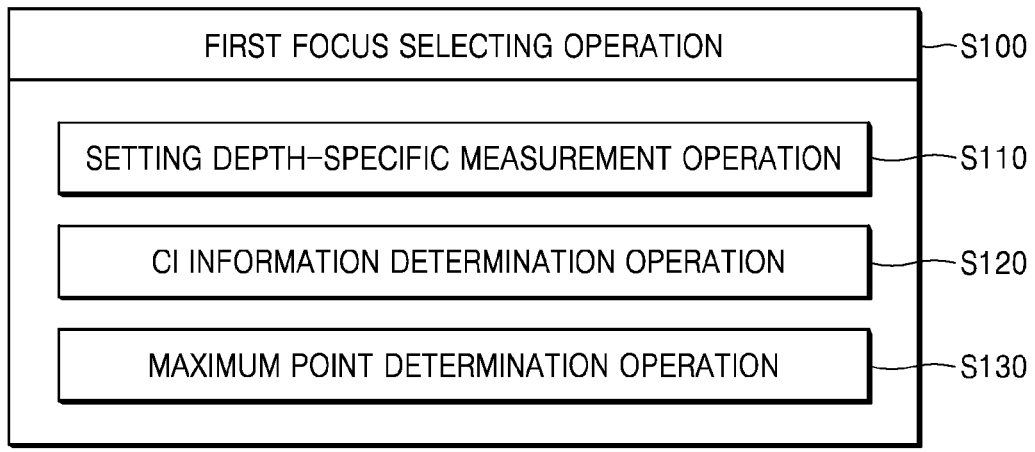
Figure 12:
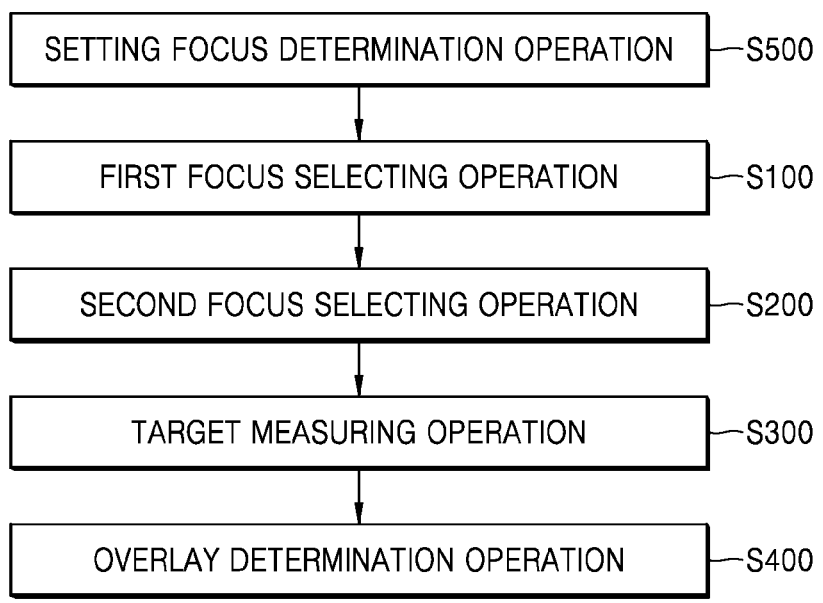

FIGS. 10 to 12 are flowcharts illustrating an overlay measurement method according to an embodiment of the disclosure.

According to an embodiment of the disclosure, the overlay measurement method may include a first focus selecting operation S100, a second focus selecting operation S200, a target measuring operation S300, and an overlay determining operation S400.

As illustrated in FIG. 10, the first focus selecting operation S100 may be an operation of directing the illumination controlling the lens assembly 200 so as to measure a plurality of images for the first layer 10 with first setting focuses among a plurality of predetermined setting focuses, determine a first maximum point based on first CI information representing a contrast change for each of the plurality of images of the first layer 10, and select the focus for the first maximum point as the first measurement focus.

Specifically, the first focus selecting operation S100 may be an operation of directing the illumination of the light source 100 to the overlay measurement target T, controlling the lens focus actuator 220 controlling a distance between the objective lens 210 and the overlay measurement target T to focus and condense the illumination on a plurality of setting focuses of the overlay measurement target T through the lens assembly 200.

Subsequently, a focal distance may be controlled by vertically moving the objective lens 210 toward a wafer W by the lens focus actuator 220 by the control of the controller 400, and the objective lens 210 may condense a beam reflected on a beam splitter 140 on measurement positions set as the plurality of setting focuses of the wafer W, such that the detector 300 may obtain focus images at the measurement position based on the beam reflected on the measurement position.

In the first focus selecting operation S100, an operation of changing the depth of the overlay measurement target T according to the plurality of setting focuses, and condensing and detecting the beam to obtain the image may be repeated.

Specifically, as illustrated in FIG. 11, the first focus selecting operation S100 may include a setting depth-specific measurement operation S110, a CI information determining operation S120, and a maximum point determining operation S130.

The setting depth-specific measurement operation S110 may be an operation of obtaining the CI of the image measured with the reference focus F0 having the largest CI value among the plurality of setting focuses as the first focus-CI information (F1,C1).

In the setting depth-specific measurement operation S110, the C1 of the image measured with the second focus F2 in which the focus is moved to one side from the reference focus F0 by a predetermined distance may be obtained as the second focus-CI information (F2,C2).

The setting depth-specific measurement operation S110 may be an operation of obtaining the CI of the image measured with the third focus F3 in which the focus is moved to one side from the second focus F2 by the predetermined distance or moved to the other side from the reference focus by the predetermined distance as the third focus-CI information (F3,C3).

For example, as illustrated in FIGS. 3 to 6, the reference focus F0 determined as a focus C0 at a point having a largest CI is measured as the first focus F1 based on the information on the first layer 10 pre-input in the setting depth-specific measurement operation S110 to obtain a first image. Further, a second image and a third image may be obtained with the movement focuses F2 and F3 which are at least two focuses in which the measurement focus is moved to one side or the other side from the first focus F1 according to the setting depth so as to determine a CI at focuses having the same interval.

In the setting depth-specific measurement operation S110, CIs for the first image, the second image, and the third image may be determined, and the CIs for the respective images may be stored as the first focus-CI information (F1,C1), the second focus-CI information (F2,C2), and the third focus-CI information (F3,C3).

The CI information determining operation S120 may be an operation of determining the CI graph based on the first focus-CI information (F1,C1), the second focus-CI information (F2,C2), and the third focus-CI information (F3,C3).

In the CI information determining operation S120, the first focus-CI information (F1,C1), the second focus-CI information (F2,C2), and the third focus-CI information (F3,C3) determined by using the Gaussian elimination may be embodied, and the embodied information may be represented by the CI graph which is the graph for the tertiary equation based on three points as illustrated in FIG. 7.

The maximum point calculating operation S130 may be an operation of determining the focus having the maximum point C4 of the CI graph as the measurement focus F4.

Specifically, as illustrated in FIG. 8, in the maximum point determining operation S130, the maximum point C4 which is a point having the largest CI value may be determined in the CI graph determined in the CI information determining operation S120. For example, in the maximum point determining operation S130, the maximum value C4 of the maximum point may be determined by using the Newton Raphson Method.

Subsequently, as illustrated in FIG. 9, in the maximum point determining operation S130, the focus having the maximum value C4 may be determined as the measurement focus F4.

That is, in the first focus selecting operation S100, a plurality of setting focus including the first focus which is the reference focus and the second focus and the third focus which are at least two movement focuses measure, and as a result, the maximum value may be determined based on at least three focus-CI information to determine an accurate measurement focus.

The second focus selecting operation S200 may be an operation of controlling the lens assembly 200 so as to measure a plurality of images for the second layer 20 with second setting focuses among a plurality of setting focuses, determine a second maximum point based on second CI information representing a contrast change for each of the plurality of images of the second layer 20, and select the focus for the second maximum point as the second measurement focus.

In the second focus selecting operation S200, the plurality of images may be measured with the second setting focuses among the plurality of setting focuses, and the performing operation may be performed in the same method as the setting depth-specific measurement operation, the CI information determining operation, and the maximum point determining operation of the first focus selecting operation S100.

As a result, by the overlay measurement method according to the disclosure, optimal focuses for accurately measuring the respective images of the first layer 10 and the second layer 20, respectively may be determined.

The target measuring operation S300 is an operation of measuring the first image of the first layer 10 with the first measurement focus and measuring the second image of the second layer 20 with the second measurement focus, and the overlay determining operation S400 may be an operation of determining a difference in center point or symmetric center between the first image and the second image as an overlay value.

In the overlay measurement method according to an embodiment of the disclosure, the overlay may be measured in each of a plurality of overlay marks formed on the scribe line.

That is, the first focus selecting operation S100, the second focus selecting operation S200, the target measuring operation S300, and the overlay determining operation S400 may be performed in each of the first layer 10 and the second layer 20 in a first overlay measurement target, and repeated in the first layer and the second layer formed in a second overlay measurement target formed at the other position.

The overlay measurement method according to the disclosure may further include a setting focus determining operation S500 before the first focus selecting operation S100 as illustrated in FIG. 12.

The setting focus determining operation S500 may be an operation of storing, as the plurality of setting focuses, a reference focus determined as a focus at a point having a largest CI based on information on the first layer 10 and the second layer 20 which are pre-input and movement focuses determined as at least two focuses moved according to the setting depth to one side or the other side from the reference focus with respect to the measurement focus so as to determine a CI at focuses having the same interval.

For example, in the setting focus determining operation S500, the plurality of setting focuses including the reference focus and the movement focuses may be determined based on wafer information in which the first layer 10 and the second layer 20 stored in the controller 400 are formed, or determined from previously measured measurement information or directly input the plurality of setting focuses from the user.

That is, the overlay measurement method according to the disclosure may determine the accurate measurement focus based on the plurality of setting focuses according to each layer in a wafer including two or more layers, and as a result, measurement accuracy is increased, and a consistent result may be derived by data based automatic optimization with respect to an optimization result which is largely influenced by individual abilities of workers.

An optimal measurement focus of an overlay measurement target may be determined by applying an existing stored reference focus as the plurality of setting focuses, and the setting focus is reflected in real time by applying the determined measurement focus to a next overlay measurement target as the plurality of setting focuses to determine a focus having high accuracy for each point.

The disclosure may include a program storage medium storing the overlay measurement method. Specifically, the disclosure may include a program storage medium storing the first focus selecting operation S100, the second focus selecting operation S200, the target measuring operation S300, and the overlay determining operation S400.

In this case, the first focus selecting operation S100, the second focus selecting operation S200, the target measuring operation S300, and the overlay determining operation S400 are the same as described above.

The program storage medium may include and store at least any one of the setting depth-specific measurement operation S110, the CI information determining operation S120, the maximum point determining operation S130, and the setting focus determining operation S500.

Various embodiments as set forth herein may be implemented as software including one or more instructions that are stored in a storage medium that is readable by a machine. For example, a processor of the machine may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The computer readable storage medium includes various recording devices storing data which may be deciphered by a computer system.

Examples of the computer readable storage medium include a server computer, and a read-only memory (ROM), a random access memory (RAM), a CD-ROM, a magnetic tape, a floppy disk, a magneto-optic disk, an optical data storage device, a flash memory, a universal serial bus (USB)

memory, and the like and may also include a device implemented as a type of a carrier wave (e.g., transmission through the Internet).

The computer readable storage medium may store and execute codes which may be distributed in the computer system connected through a network and read by a computer in a distribution method.

According to some embodiments of the disclosure, an accurate measurement focus may be determined based on a setting focus according to each layer in a wafer including two or more layers, and as a result, measurement accuracy is increased, and a consistent result may be derived by data based automatic optimization with respect to an optimization result, which may be largely influenced by individual abilities of workers.

An optimal measurement focus of an overlay measurement target may be determined by applying an existing stored reference focus as a setting focus, and the setting focus may be reflected in real time by applying the determined measurement focus to a next overlay measurement target as the setting focus to determine a focus having high accuracy for each point.

At least one of the devices, units, components, modules, units, or the like represented by a block or an equivalent indication in the above embodiments including but not limited to FIG. 2 may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein)

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. An overlay measurement device comprising:
   a light source configured to direct an illumination to an overlay measurement target in which a first overlay key in a first layer and a second overlay key in a second layer are positioned, the second layer being stacked on an upper portion or a lower portion of the first layer;
   a lens assembly comprising:
      an objective lens configured to condense the illumination on a measurement position of at least one point in the overlay measurement target; and
      a lens focus actuator configured to control a distance between the objective lens and the overlay measurement target;
   a detector configured to acquire a focus image at the measurement position based on a beam reflected on the measurement position; and
   a controller configured to:
      control the lens assembly to measure a plurality of images with a plurality of predetermined setting focuses;
      determine a maximum point of a contrast index (CI) value for a focus change based on a plurality of CI information indicating a change of contrast of each of the plurality of images; and
      select a focus for the maximum point as a measurement focus.

2. The overlay measurement device of claim 1, wherein the controller is further configured to:
   obtain, as first focus-contrast index information, a first CI of an image measured with a reference focus having a largest CI value among the plurality of predetermined setting focuses,
   obtain, as second focus-contrast index information, a second CI of the image measured with a second focus in which a focus is moved to a first side from the reference focus by a predetermined distance,
   obtain, as third focus-contrast index information, a third CI of the image measured with a third focus in which the focus is moved to the first side from the second focus by the predetermined distance or moved to a second side from the reference focus by the predetermined distance,
   determine a CI graph based on the first focus-contrast index information, the second focus-contrast index information, and the third focus-contrast index information, and
   determine a focus having the maximum point in the CI graph as the measurement focus.

3. The overlay measurement device of claim 1, wherein the controller comprises:
   a storage configured to store depth-specific focus images of the overlay measurement target measured by the plurality of predetermined setting focuses,
   a CI calculation device configured to determine a CI based on the depth-specific focus images of the overlay measurement target, and
   a maximum point calculation device configured to:
      determine the CI based on the depth-specific focus images of the overlay measurement target determined by the CI calculation device by a continuous CI graph; and
      determine a focus of a maximum contrast index in the continuous CI graph.

4. The overlay measurement device of claim 3, wherein the controller further comprises an overlay calculation device configured to determine, as an overlay value, a difference in center points or symmetric centers between a first image and a second image measured with a first measurement focus for the first layer and a second measurement focus for the second layer, respectively.

5. The overlay measurement device of claim 1, wherein the controller is further configured to:
   measure a plurality of images for the first layer with first setting focuses among the plurality of predetermined setting focuses;
   determine a first maximum point based on first CI information representing a contrast change for each of the plurality of images of the first layer;
   select the focus for the first maximum point as a first measurement focus,
   measure a plurality of images for the second layer with second setting focuses among the plurality of predetermined setting focuses;
   determine a second maximum point based on second CI information representing a contrast change for each of the plurality of images of the second layer;
   select the focus for the second maximum point as a second measurement focus; and determine, as an overlay value, a difference in center point or symmetric center between a first image measured with the first measurement focus and a second image measured with the second measurement focus.

6. The overlay measurement device of claim 1, wherein the controller further comprises a lens operator configured to control an operation of the lens focus actuator to acquire focus images of the overlay measurement target for each depth based on the plurality of predetermined setting focuses.

7. The overlay measurement device of claim 1, wherein the plurality of predetermined setting focuses comprises:
a reference focus determined as a focus at a point having a largest CI based on information about the first layer and the second layer which are pre-input; and
a movement focus determined as at least two focuses moved based on a setting depth to a first side or a second side from the reference focus with respect to the measurement focus.

8. An overlay measurement method comprising:
directing, by a light source, an illumination to an overlay measurement target in which a first overlay key in a first layer and a second overlay key in a second layer are positioned, the second layer being stacked on an upper portion or a lower portion of the first layer;
condensing, by an objective lens, the illumination on a measurement position of at least one point in the overlay measurement target;
controlling, by a lens actuator, a distance between the objective lens and the overlay measurement target;
acquiring a focus image at the measurement position based on a beam reflected on the measurement position;
controlling a lens assembly to measure a plurality of images with a plurality of predetermined setting focuses;
determining a maximum point of a contrast index (CI) value for a focus change based on a plurality of CI information indicating a change of contrast of each of the plurality of images; and
selecting a focus for the maximum point as a measurement focus.

9. The overlay measurement method of claim 8, further comprising:
obtaining, as first focus-contrast index information, a first CI of an image measured with a reference focus having a largest CI value among the plurality of predetermined setting focuses;
obtaining, as second focus-contrast index information, a second CI of the image measured with a second focus in which a focus is moved to a first side from the reference focus by a predetermined distance;
obtaining, as third focus-contrast index information, a third CI of the image measured with a third focus in which the focus is moved to the first side from the second focus by the predetermined distance or moved to a second side from the reference focus by the predetermined distance,
determining a CI graph based on the first focus-contrast index information, the second focus-contrast index information, and the third focus-contrast index information, and
determining a focus having a maximum point in the CI graph as the measurement focus.

10. The overlay measurement method of claim 8, further comprising, prior to selecting the focus for a first maximum point as a first measurement focus:
storing, as the plurality of predetermined setting focuses:
a reference focus determined as a focus at a point having a largest CI based on information about the first layer and the second layer which are pre-input; and
movement focuses determined as at least two focuses moved based on a setting depth to a first side or a second side from the reference focus with respect to the measurement focus; and
determining a CI at focuses having a same interval.

11. The overlay measurement method of claim 10, further comprising determining, as an overlay value, a difference in center points or symmetric centers between a first image and a second image measured with a first measurement focus for the first layer and a second measurement focus for the second layer, respectively.

12. The overlay measurement method of claim 8, further comprising:
measuring a plurality of images for the first layer with first setting focuses among the plurality of predetermined setting focuses;
determining a first maximum point based on first CI information representing a contrast change for each of the plurality of images of the first layer;
selecting the focus for the first maximum point as a first measurement focus,
measuring a plurality of images for the second layer with second setting focuses among the plurality of predetermined setting focuses;
determining a second maximum point based on second CI information representing a contrast change for each of the plurality of images of the second layer;
selecting the focus for the second maximum point as a second measurement focus; and
determining, as an overlay value, a difference in center point or symmetric center between a first image measured with the first measurement focus and a second image measured with the second measurement focus.

13. The overlay measurement method of claim 8, further comprising acquiring focus images of the overlay measurement target for each depth based on the plurality of predetermined setting focuses.

14. The overlay measurement method of claim 8, wherein the plurality of predetermined setting focuses comprises:
a reference focus determined as a focus at a point having a largest CI based on information about the first layer and the second layer which are pre-input; and
a movement focus determined as at least two focuses moved based on a setting depth to a first side or a second side from the reference focus with respect to the measurement focus.

15. A non-transitory, computer-readable storage medium storing instructions that, when executed by at least one processor, cause the at least one processor to:
direct, by a light source, an illumination to an overlay measurement target in which a first overlay key in a first layer and a second overlay key in a second layer are positioned, the second layer being stacked on an upper portion or a lower portion of the first layer;
condense, by an objective lens, the illumination on a measurement position of at least one point in the overlay measurement target;
control, by a lens actuator, a distance between the objective lens and the overlay measurement target;
acquire a focus image at the measurement position based on a beam reflected on the measurement position;

control a lens assembly to measure a plurality of images with a plurality of predetermined setting focuses;

determine a maximum point of a contrast index (CI) value for a focus change based on a plurality of CI information indicating a change of contrast of each of the plurality of images; and select a focus for the maximum point as a measurement focus.

16. The storage medium of claim 15, wherein the instructions, when executed, further cause the at least one processor to:

obtain, as first focus-contrast index information, a first CI of an image measured with a reference focus having a largest CI value among the plurality of predetermined setting focuses;

obtain, as second focus-contrast index information, a second CI of the image measured with a second focus in which a focus is moved to a first side from the reference focus by a predetermined distance;

obtain, as third focus-contrast index information, a third CI of the image measured with a third focus in which the focus is moved to the first side from the second focus by the predetermined distance or moved to a second side from the reference focus by the predetermined distance;

determine a CI graph based on the first focus-contrast index information, the second focus-contrast index information, and the third focus-contrast index information; and determine a focus having the maximum point in the CI graph as the measurement focus.

17. The storage medium of claim 15, wherein the instructions, when executed, further cause the at least one processor to:

store depth-specific focus images of the overlay measurement target measured by the plurality of predetermined setting focuses;

determine a CI based on the depth-specific focus images of the overlay measurement target;

determine the CI based on the depth-specific focus images of the overlay measurement target determined by a continuous CI graph; and determine a focus of a maximum contrast index in the continuous CI graph.

18. The storage medium of claim 17, wherein the instructions, when executed, further cause the at least one processor to:

determine, as an overlay value, a difference in center points or symmetric centers between a first image and a second image measured with a first measurement focus for the first layer and a second measurement focus for the second layer, respectively.

19. The storage medium of claim 15, wherein the instructions, when executed, further cause the at least one processor to:

measure a plurality of images for the first layer with first setting focuses among the plurality of predetermined setting focuses;

determine a first maximum point based on first CI information representing a contrast change for each of the plurality of images of the first layer;

select the focus for the first maximum point as a first measurement focus, measure a plurality of images for the second layer with second setting focuses among the plurality of predetermined setting focuses;

determine a second maximum point based on second CI information representing a contrast change for each of the plurality of images of the second layer;

select the focus for the second maximum point as a second measurement focus; and determine, as an overlay value, a difference in center point or symmetric center between a first image measured with the first measurement focus and a second image measured with the second measurement focus.

20. The storage medium of claim 15, wherein the instructions, when executed, further cause the at least one processor to:

acquire, by a lens operator, focus images of the overlay measurement target for each depth based on the plurality of predetermined setting focuses.

* * * * *